United States Patent [19]

Maruyama et al.

[11] Patent Number: 4,923,726

[45] Date of Patent: May 8, 1990

[54] LIGHTSAFE MASKING FILM

[75] Inventors: Hiroshi Maruyama, Misato; Yoshiharu Horii, Kasukabe, both of Japan

[73] Assignee: Somar Corporation, Japan

[21] Appl. No.: 279,028

[22] Filed: Dec. 2, 1988

[51] Int. Cl.$^5$ ............................................... B32B 7/06
[52] U.S. Cl. .................................... 428/40; 428/215; 428/483; 428/412; 428/522; 428/476.3
[58] Field of Search .............. 428/40, 500, 215, 483, 428/412, 522, 476.3

[56] References Cited

U.S. PATENT DOCUMENTS

| | | | |
|---|---|---|---|
| 2,321,046 | 5/1941 | Rudnick | 41/46 |
| 3,127,301 | 3/1964 | Sigler | 161/6 |
| 3,892,900 | 7/1975 | Shima et al. | 428/40 |
| 4,681,784 | 7/1987 | Ebara et al. | 428/40 |

*Primary Examiner*—Edith Buffalow
*Attorney, Agent, or Firm*—Lorusso & Loud

[57] ABSTRACT

A composite, lightsafe masking film is disclosed which comprises a substrate formed of a plastic material, and a lightsafe layer peelably provided over the surface of said substrate. A fluorescent substance is incorporated into the lightsafe layer, or a fluorescent substance-containing layer is provided on the surface of the lightsafe layer or between the lightsafe layer and the substrate, so that a cutting line formed on the lightsafe layer fluoresces under illuminated conditions to form a legible pattern.

10 Claims, No Drawings

LIGHTSAFE MASKING FILM

This invention relates generally to a lightsafe masking film and, more specifically, to a composite, lightsafe masking film to be used as an original copy having a transparent pattern in the photomechanical reproduction process.

One known lightsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there leaves a desired transparent pattern on the masking film.

Since the cutting line formed by means of a cutting blade or knife having a keen edge is very thin and, therefore, is unclear and illegible, succeeding peeling works become laborious and encounter a considerable difficulty.

The present invention has been made to overcome the problem of the conventional lightsafe masking film and is contemplated to provide a lightsafe masking film comprising a substrate formed of a plastic material, and a lightsafe layer peelably provided over the surface of said substrate and containing a fluorescent substance so that a cutting line formed on said lightsafe layer fluoresces under illuminated conditions to form a legible pattern.

In another aspect, the present invention provides a lightsafe masking film comprising a substrate formed of a plastic material, a lightsafe layer peelably provided over said substrate, and a fluorescent layer containing a fluorescent substance and provided between said substrate and said lightsafe layer or over said lightsafe layer, so that a cutting line formed in the lightsafe layer fluoresces under illuminated conditions to form a legible pattern.

The present invention will now be described in detail below.

Lightsafe masking film according to the present invention is comprised of a substrate formed of a plastic material having provided thereon a peelable, lightsafe layer.

Any plastic material conventionally used in the substrate of known lightsafe masking film can be used for the purpose of the present invention. Transparent plastic films such as polyethylene terephthalate films, polybutylene terephthalate films, polyoxybenzoate films and polycarbonate films may be suitably used as the substrate. Both stretched and unstretched films may be used. The thickness of the film is generally in the range of 20–300 $\mu$m.

The substrate is overlaid with a peelable, lightsafe layer. The lightsafe layer is generally comprised of (a) a binder such as a synthetic rubber, e.g. a nitrile rubber, or a synthetic resin, e.g. a vinyl chloride/vinylidene chloride copolymer or a vinyl chloride/vinyl acetate copolymer, and (b) a lightsafe or light-shading substance such as a colorant, e.g. an organic or inorganic dye or pigment. The lightsafe substance is preferably so selected as to provide a lightsafe layer capable of preventing the passage of a light having wavelength of about 300–550 nm therethrough. Any binder and any lightsafe substance customarily employed in lightsafe layers of known lightsafe masking films may be used for the purpose of the present invention. The lightsafe layer may further contain one or more additives used in conventional masking films, if desired. The lightsafe layer generally has a thickness of 20–50 $\mu$m, preferably 25–40 $\mu$m.

In one embodiment according to the present invention, a fluorescent substance is incorporated into the lightsafe layer. By this, when the lightsafe layer is cut at the time of the formation of a desired transparent pattern on the masking film, the cut line becomes clear and legible under illuminated conditions because of the fluorescence of the fluorescent substance. The formation of the clear fluorescent line along the cutting line is considered to be attributed (a) to an increased intensity of a light to be absorbed by the fluorescent substance because of irregular reflection on the edge of the cutting line and (b) to an increased density, at the cutting line, of the fluorescent substance exposed to the light.

As the fluorescent substance, there may be used a substance capable of absorbing a visible or ultraviolet light and of fluorescing a light with a wavelength of a visible region, preferably a substance capable of absorbing purple, blue or green visible light and of fluorescing a light with a longer wavelength than the absorbed light. Organic or inorganic fluorescent dyes or pigments may be suitably used. Illustrative of suitable fluorescent substances are organic ones such as Uranine-series, Eosine-series, Rhodamine-series, Thioflavine-series, Trypaflavin-series, Auramine-series and coumarin-series fluorescent dyes.

The fluorescent substance is preferably used in the form of a fine powder or a paste. The amount of the fluorescent substance in the lightsafe layer is generally in the ragne of 2–50% by weight, preferably 5–30% by weight. The by weight ratio of the fluorescent substance to the lightsafe substance is preferably in the range of 5:95 to 80:20, more preferably in the range of 20:80 to 60:40. The masking film of the above embodiment may be obtained by applying a coating composition containing the binder, lightsafe substance, fluorescent substance, etc. over the surface of the substrate, followed by drying the coated layer.

In another embodiment according to the present invention, rather than incorporating the fluorescent substance into the lightsafe layer as in the above embodiment, a layer containing such a fluorescent substance is formed as an overcoat layer over the surface of the lightsafe layer or as an undercoat layer between the substrate and the lightsafe layer. In this embodiment, too, when a cuting line is formed in the lightsafe layer at the time of the formation of a transparent pattern on the masking film, the cutting line fluoresces strongly to permit easy recognition thereof, thereby making the succeeding peeling and removing works easy.

The overcoat or undercoat layer may be composed of a binder such as used in the lightsafe layer and the fluorescent substance. The thickness of the undercoat or overcoat layer is generally 0.5–25 $\mu$m, preferably 2–20 $\mu$m. The overcoat layer may be formed by applying a coating composition containing fluorescent substance and the binder over the surface of the lightsafe layer. The undercoat layer may be formed by applying a similar coating composition over the surface of the substrate, followed by the formation of the lightsafe layer over the undercoat layer.

The following examples will further illustrate the present invention.

EXAMPLE 1

Preparation of Coating Composition:

A coating liquid having the composition shown in Table below was prepared:

| Ingredient | Content (part by weight) |
| --- | --- |
| Lightsafe substance*[1] | 2 |
| Fluorescent substance*[2] | 2 |
| Acrylonitrile-butadiene rubber | 6 |
| Vinylchloride-vinylidene chloride copolymer | 20 |
| Toluene | 35 |
| Methyl ethyl ketone | 35 |

*[1]OIL YELLOW 101 (Trademark) manufactured by Orient Chemical Industry Co., Ltd., Japan; color: yellow
*[2]MPI-503 (Trademark) manufactured by Nihon Keiko Kagaku Kabushiki Kaisha, Japan; color: red Preparation of Masking Film:

The above coating composition was applied over the surface of a substrate of polyethylene terephthalate film (thickness: 100 μm) and dried to obtain a lightsafe layer having a thickness of 25 μm. The lightsafe layer was orange in color and was capable of preventing the passage of a light with a wavelength of 300–490 nm therethrough. When the lightsafe layer on the substrate was cut with a knife, the cutting line strongly fluoresced and became pink, permitting easy identification of the cutting line.

EXAMPLE 2

A first coating liquid having the same composition as that in Example 1 except that no fluorescent substance was incorporated was prepared and applied in the same manner as in Example 1 over the surface of a polyethylene terephthalate film substrate, thereby forming a peelable, lightsafe layer having a thickness of 13 μm on the surface of the substrate. Then, a second coating liquid composed of 2 parts by weight of the fluorescent substance used in Example 1, 6 parts by weight of a acrylonitrile-butadiene rubber, 25 parts by weight of a vinyl chloride/vinylidene chloride copolymer, 36 parts by weight of toluene and 36 parts by weight of methyl ethyl ketone, was applied to the surface of the lightsafe layer and dried to form an overcoat layer having a thickness of 12 μm. The resulting masking film was capable of preventing the passage of a light with a wavelength of 300–490 nm therethrough. When the lightsafe layer was cut with a knife, the cutting line strongly fluoresced and became pink, permitting easy identification of the cutting line.

EXAMPLE 3

Over a polyethylene terephthalate film substrate, the second coating liquid used in Example 2 was applied in the same manner as that in Example 2 to form an undercoat layer having a thickness of 12 μm. Then the first coating liquid used in Example 2 was applied on the surface of the undercoat layer to form a lightsafe layer having a thickness of 13 μm. The resulting masking film was capable of preventing the passage of a light with a wavelength of 300–490 nm therethrough. When the lightsafe layer was cut with a knife, the cutting line strongly fluoresced and became pink, permitting easy identification of the cutting line.

What is claimed is:

1. A lightsafe masking film comprising a substrate formed of a plastic material, and a lightsafe layer peelably provided over the surface of said substrate and containing a fluorescent substance so that a cutting line formed on said lightsafe layer fluoresces under illuminated conditions to form a legible pattern.

2. A lightsafe masking film as claimed in claim 1, wherein the content of the fluorescent substance in the lightsafe layer is 2–50% by weight.

3. A lightsafe masking film as claimed in claim 1, wherein the lightsafe layer includes a binder, a lightsafe substance and the fluorescent substance.

4. A lightsafe masking film as claimed in claim 3, wherein by weight ratio of the fluorescent substance to the lightsafe substance is in the range of 5:95 to 80;20.

5. A lightsafe masking film as claimed in claim 1, wherein said lightsafe layer has a thickness of 20–50 μm.

6. A lightsafe masking film comprising a substrate formed of a plastic material, a lightsafe layer peelably provided over said substrate, and a fluorescent layer containing a fluorescent substance and provided between said substrate and said lightsafe layer or over said lightsafe layer, so that a cutting line formed in the lightsafe layer fluoresces under illuminated conditions to form a legible pattern.

7. A lightsafe masking film as claimed in claim 6, wherein the fluorescent substance is used in an amount of 2–50% by weight based on the total weight of the lightsafe layer and said fluorescent layer.

8. A lightsafe masking film as claimed in claim 6, wherein the lightsafe layer includes a first binder and a lightsafe substance and the fluorescent layer includes a second binder and said fluorescent substance.

9. A lightsafe masking film as claimed in claim 8, wherein by weight ratio of the fluorescent substance to the lightsafe substance is in the range of 5:95 to 80:20.

10. A lightsafe masking film as claimed in claim 6, wherein said lightsafe layer has a thickness of 20–50 μm and said fluorescent layer has a thickness of 0.5–25 μm.

* * * * *